United States Patent [19]
Gersbach et al.

[11] Patent Number: 5,508,660
[45] Date of Patent: Apr. 16, 1996

[54] CHARGE PUMP CIRCUIT WITH SYMMETRICAL CURRENT OUTPUT FOR PHASE-CONTROLLED LOOP SYSTEM

[75] Inventors: John E. Gersbach, Burlington; Ilya I. Novof, Essex Junction, both of Vt.

[73] Assignee: International Business Machines Corporation, Armonk, N.Y.

[21] Appl. No.: 428,391

[22] Filed: Apr. 25, 1995

Related U.S. Application Data

[63] Continuation of Ser. No. 131,646, Oct. 5, 1993, abandoned.

[51] Int. Cl.[6] .................................................. H03L 7/089
[52] U.S. Cl. ........................ 331/17; 331/25; 331/8; 327/157
[58] Field of Search ........................... 331/17, 25, 8, 331/1 A; 307/514; 328/135; 327/157, 536, 537, 538

[56] References Cited

U.S. PATENT DOCUMENTS

| | | | |
|---|---|---|---|
| 3,821,658 | 6/1974 | Hoeft | 331/8 |
| 4,494,080 | 1/1985 | Call | 331/8 |
| 4,525,686 | 6/1985 | Yokoya | 331/17 |
| 4,714,900 | 12/1987 | Sata | 331/8 |
| 4,814,726 | 3/1989 | Byrd et al. | 331/1 A |
| 4,885,552 | 12/1989 | Boudewijns | 331/1 A |
| 4,970,472 | 11/1990 | Kennedy et al. | 331/8 |
| 5,068,626 | 11/1991 | Takagi et al. | 331/17 |
| 5,166,641 | 12/1992 | Davis et al. | 331/1 A |
| 5,363,066 | 11/1994 | Chen et al. | 331/17 |

FOREIGN PATENT DOCUMENTS

| | | |
|---|---|---|
| 0405523A2 | 1/1991 | European Pat. Off. . |
| 0561526A2 | 9/1993 | European Pat. Off. . |
| 2257587 | 1/1993 | United Kingdom . |

*Primary Examiner*—Robert Pascal
*Assistant Examiner*—Arnold Kinkead
*Attorney, Agent, or Firm*—Heslin & Rothenberg

[57] ABSTRACT

A phase-controlled loop system having a charge pump circuit including a current mismatch measurement circuit and a current compensation circuit for equalizing the amplitude of positive current pulses and the amplitude of negative current pulses output when the phase-controlled loop system is in phase-locked condition. The current mismatch measurement circuit includes duplicate complementary current sources with characteristics and biasing substantially identical to that of the primary current sources providing the positive current and the negative current to the output node of the charge pump circuit. At the common connected node between the duplicate complementary current sources an error current is produced having an amplitude equal to the difference between the amplitude of the positive current pulses and the amplitude of the negative current pulses to the output node. Current mirrors then reflect this error current back to either the positive current source or the negative current source for combining with the positive current or negative current, respectively, such that the currents' amplitudes at the output node substantially cancel. Various current mismatch measurement circuit and current compensation circuit embodiments are described, including a time multiplexed sensing and compensation approach.

20 Claims, 4 Drawing Sheets

CHARGE PUMP CIRCUIT WITH SYMMETRICAL CURRENT OUTPUT FOR PHASE-CONTROLLED LOOP SYSTEM

This application is a continuation of application No. 08/131,646, filed Oct. 5, 1993, now abandoned.

TECHNICAL FIELD

This invention relates generally to phase-controlled loop systems and, more particularly, to a symmetrical charge pump circuit for coupling between a phase comparator and an output filter of a phase-locked loop system or similar controlled system to add charge to or remove charge from the filter with minimum static offset error during phase-locked condition.

BACKGROUND ART

A typical phase-locked loop (PLL) system includes a phase comparator, a charge pump, a low-pass filter and a voltage-controlled oscillator (VCO). These elements are coupled together to form a closed-loop system wherein the phase comparator measures differences in phase between an input reference signal and a feedback signal from the output of the VCO. Any detected difference generates an error signal which is fed through the charge pump to the filter for supply to the VCO. The charge pump, positioned between the phase comparator and the filter, provides either a positive current source to add charge to the filter or a negative current source to remove charge from the filter based upon the error signal output from the phase comparator. The VCO utilizes the control voltage across the filter to minimize the frequency difference between the PLL feedback signal and the input reference signal.

One embodiment of a PLL charge pump circuit having positive and negative current sources is presented in U.S. Pat. No. 4,814,726. This patent describes a phase detector and charge pump circuit combination for use in a digital PLL circuit. The phase detector includes a reset circuit that responds to the charge pump when the charge pump is simultaneously sourcing and sinking current. The charge pump's up and down circuits are balanced in an attempt to minimize conduction during a phase-locked condition. However, there is no attempt to compensate for second order current mismatching resulting from the presence of a control voltage on the output node of the charge pump.

Existing PLL charge pump circuits often output a current that is a function of the control voltage across the filter. Such circuits typically exhibit an offset error when the PLL system is in phase-locked condition. This is because the current sources have a finite output impedance due to channel length modulation (CMOS technology) or base width modulation (bipolar technology), meaning that the output currents are a weak but significant function of output voltage. This relationship can result in an amplitude mismatch between the output of the positive current source and the output of the negative current source when in phase-locked condition. Such current mismatching is exhibited as a static offset error within the PLL system and manifested as a phase difference between the input reference clock and the PLL output clock. Because PLL systems are widely used in clock distribution applications, avoidance of a phase difference between the reference system clock and the PLL output clock is desirable since any phase difference degrades system performance. A charge pump circuit in accordance with the present invention addresses this concern.

DISCLOSURE OF THE INVENTION

Briefly summarized, the present invention comprises in one aspect a current source circuit suitable for use in a phase-controlled loop system having a filter. The current source circuit includes an output node coupled to the filter so as to provide a control voltage thereto. A positive current source and a negative current source are connected to the output node. Each current source supplies a different one of a positive current and a negative current to the output node. The positive and negative currents each have an amplitude dependent upon the control voltage at the output node. A feedback means senses an amplitude difference between the amplitude of the positive current and the amplitude of the negative current and compensates at the output node such that the amplitude difference is cancelled.

Numerous specific embodiments of the current source circuit are described. In several embodiments, the positive current source and the negative current source comprise a primary pair of complementary current sources and the feedback sensing means includes a secondary pair of complementary current sources fabricated and connected so as to provide an identical positive current and an identical negative current to a common node as the positive current and negative current supplied by the primary complementary current sources to the output node. Further, a voltage follower circuit can connect the output node of the primary complementary current sources and the common node of the duplicate secondary complementary current sources. Feedback compensation means can be coupled to the common node for return of an error current to the output node, e.g., via a first current mirror for addition of a positive amplitude current or a second current mirror for addition of a negative amplitude current.

In another aspect, the invention comprises a phase-locked loop (PLL) system for providing an output signal in phase with a received reference signal. The PLL system includes a phase comparator having a first input coupled to receive the reference signal and a second input coupled to receive as feedback the output signal. The phase comparator compares the phases of the reference signal and the output signal and selectively provides either a charge increase command or a charge decrease command based upon a detected phase offset. A filter having a filter node has control voltage applied thereto. The filter node is connected to a voltage controlled oscillator which provides the output signal in response to the control voltage across the filter. A charge pump is coupled between the phase detector and the filter and has an output node connected to the filter node. The charge pump includes means for sourcing a positive current to the output node in response to a charge increase and means for sourcing a negative current to the output node in response to a charge decrease command. The charge pump further includes feedback means for sensing an amplitude difference between the amplitude of the positive current and the amplitude of the negative current supplied to the output node by the charge pump when the PLL system is in phase-locked condition and for compensating at the output node for the amplitude difference such that positive and negative currents of equal amplitude are produced at the output node of the charge pump when the PLL system is in phase-locked condition.

In all embodiments, a current source circuit for a phase-controlled loop system is provided which exhibits no offset error when in phase-locked condition. This is attained via a current mismatch measurement circuit and a current compensation circuit which cooperate to equalize the amplitude of positive current pulses and the amplitude of negative current pulses at the output node of the charge pump circuit when the phase-controlled loop system is in phase-locked condition. Eliminating offset error enhances phase alignment of, for example, a PLL clock output and an input reference clock, thereby improving system performance.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
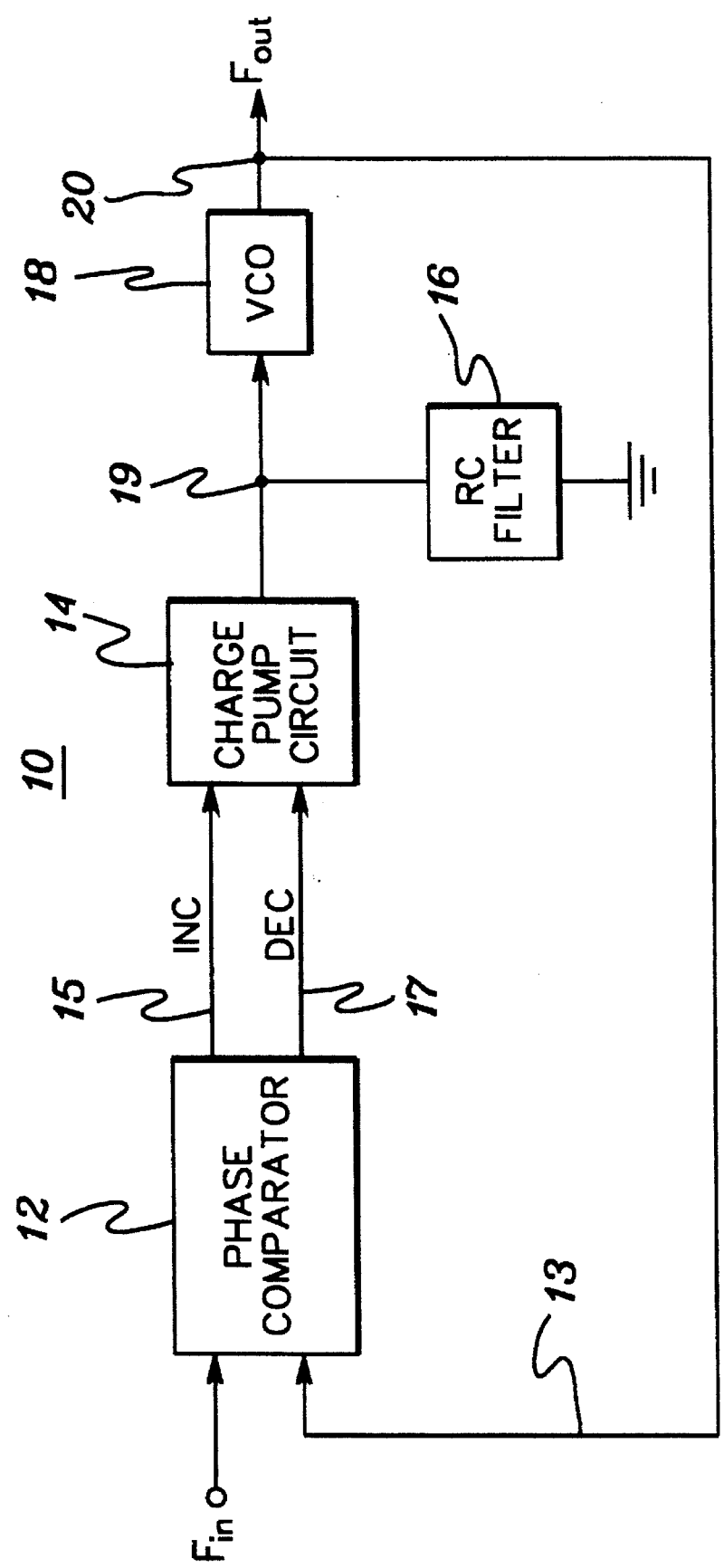
FIG. 1 is a block diagram of a phase-locked loop system to utilize a symmetrical charge pump circuit in accordance the present invention.

By way of example, FIG. 1 illustrates a phase-locked loop (PLL) system, generally denoted 10, incorporating a charge pump circuit 14 pursuant to the present invention. System 10 receives a reference input $F_{in}$ such as a stable input source signal produced by a crystal controlled oscillator (not shown). If desired, a frequency divider (also not shown) could be interposed therewith at the reference input to PLL system 10. Reference signal $F_{in}$ comprises one input to a phase comparator 12 which compares the reference input with a feedback signal $F_{out}$ on line 13 to produce an output on either an increment "INC" line 15 or a decrement "DEC" line 17. An increment "INC" signal directs charge pump circuit 14 to provide a positive source current to its output node 19, while a decrement "DEC" signal on line 17 directs the charge pump to provide a negative current at output node 19. An RC low pass filter 16 maintains a control voltage $V_{RC}$ at node 19 (shown as node 31 in the remaining drawings), for supply to the input of a voltage controlled oscillator (VCO) 18. The signal $F_{out}$ at VCO output terminal 20, representing the PLL system output, is fed back via line 13 to the second input of phase comparator 12. The PLL system adjusts voltage controlled oscillator 18 until inputs $F_{in}$ and $F_{out}$ to the phase comparator are in phase. Once the inputs are in phase, a phase-locked condition exists within the system.

Assuming that the charge pump circuit of the PLL system outputs perfectly symmetrical pulses, then there is no predisposition for the system to wander when in phase-locked condition. However, a non-symmetrical output is typical where current source output currents have amplitudes with second order dependencies on the voltage at the output terminal of the charge pump circuit. Within such systems, constant correction must be made to maintain a phase-locked condition. Ideally, the amplitude of positive current pulses and the amplitude of negative current pulses supplied by the charge pump circuit to the VCO control node occur substantially simultaneously and are equal when in phase-locked condition. Otherwise, a dead band exists between reference signal $F_{in}$ and output signal $F_{out}$ where the two signals can differ by a small amount without producing a change in the VCO.

As a more detailed example, consider a CMOS charge pump implementation wherein PFETs are employed as a positive current source and NFETs are employed as a negative current source. Assume further that an output PFET and an output NFET are paired as complementary current sources and that these complementary current sources are coupled to the filter node at the output of the charge pump circuit. With such a configuration, a positive control voltage at the output node results in a positive current pulse to the filter node of somewhat smaller amplitude than the amplitude of the negative current pulse when in phase-locked condition. This is because the PFET operating as positive current source is operating in non-linear saturation mode. Similarly, if a negative control voltage exists at the filter node then the amplitude of the negative current pulse to the filter node from the negative current source will be slightly smaller than the amplitude of the positive current output by the charge pump circuit when in phase-locked condition. The present invention detects and compensates for such current amplitude mismatching between the positive current and the negative current produced by the pair of complementary current sources when the phase-controlled loop system is in phase-locked condition.

Figure 2:
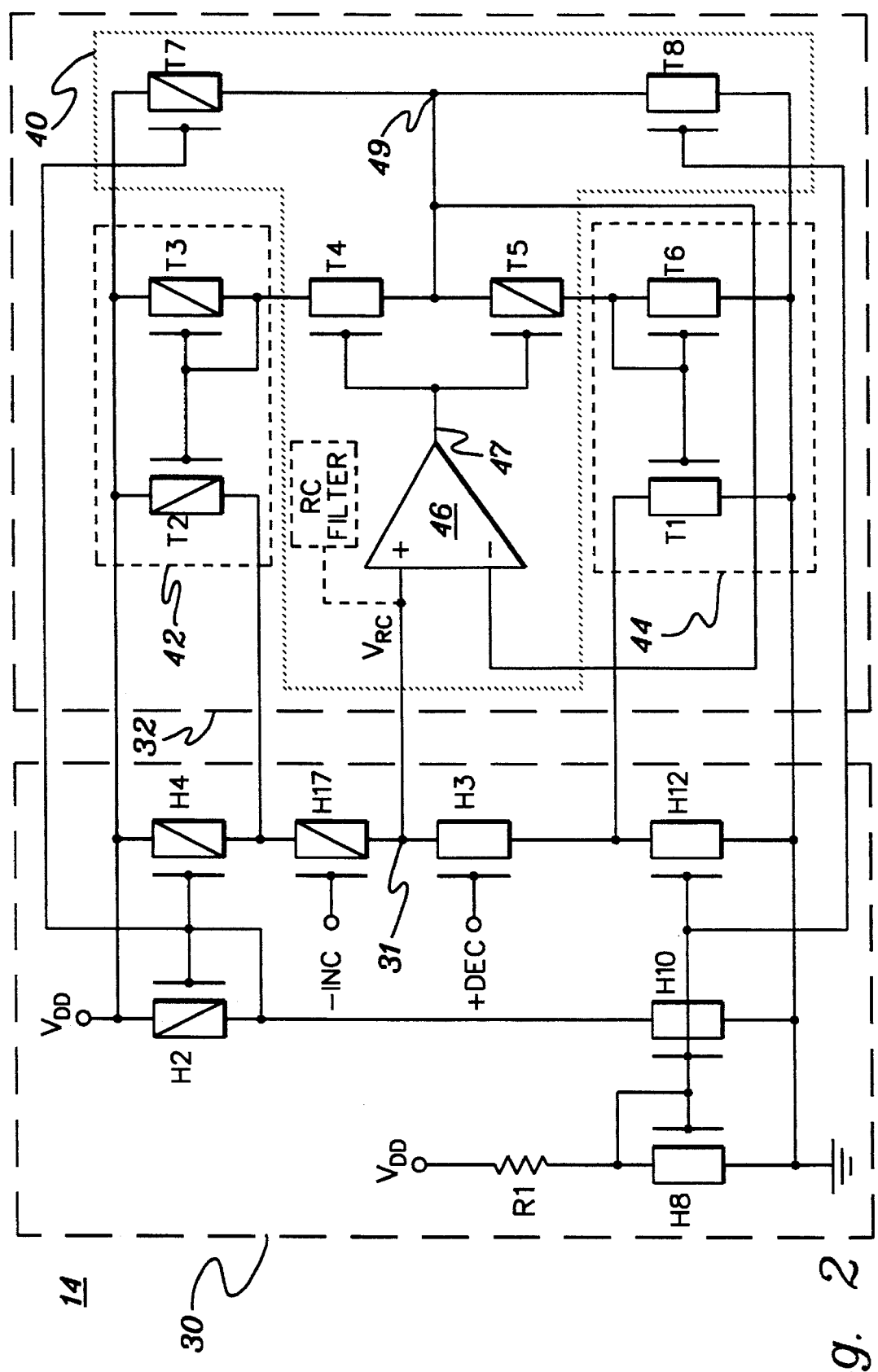
FIG. 2 is a schematic diagram of one embodiment of a symmetrical charge pump circuit in accordance with the present invention.

FIG. 2 depicts one embodiment of charge pump circuit 14 pursuant to the present invention. This circuit and the alternate embodiments thereof depicted in FIGS. 3 & 4 include complementary metal oxide semiconductor (CMOS) circuits with p-channel field-effect transistors (PFETs) indicated in the drawings by a rectangle with a diagonal line formed therein and a control element or gate electrode arranged adjacent thereto and with n-channel field-effect transistors (NFETs) indicated by a rectangle without a diagonal line and with a control element or gate electrode arranged adjacent thereto.

Circuit 14 can be divided into two principal parts. A first part 30, outlined in phantom, comprises a conventional CMOS charge pump circuit. In this implementation, PFET H4 and NFET H12 are paired as the primary complementary current sources. PFET H4 provides a positive current pulse at an output node 31. PFET H4 is connected to filter node 19 of FIG. 1 by a pass gate PFET H17. PFET H17 is active when a negative increment "–INC" pulse is received at its control gate. Similarly, NFET H12 comprises the primary negative current source and is coupled to output node 31 by a pass gate NFET H3. Pass gate H3 is active when a positive decrement "+DEC" pulse is received at its control gate.

The current reference circuit is made up of resistor R1, NFET H8, NFET H10 and PFET H2. NFET H8 is connected in diode configuration such that parallel connected NFET H10 and H12 will have substantially the same current passing therethrough as the current through NFET H8. The connection between PFET H2 and NFET H10 reflects current from the negative current reference portion to the positive current source portion of the charge pump circuit. PFETs H2 & H4 comprise a first current mirror set, while NFETs H8, H10 and H12 comprise a second current mirror set within charge pump circuit 30.

Charge pump circuit 30 is provided by way of example only. The concepts discussed herein are equally applicable to other basic charge pump circuit configurations and to other technologies, such as bipolar transistor technology. A common feature of all such circuits, however, is the existence of a pair of complementary current sources at the circuit output which produce positive current pulses and negative current pulses that are dependent upon the control voltage at the circuit's output when the phase-controlled loop system is in phase-locked condition.

Continuing with FIG. 2 discussion, second portion 32 of charge pump circuit 14 comprises one embodiment of a current compensation circuit in accordance with the present invention. This circuit is subdivided into a current mismatch measurement circuit 40 (shown in phantom) and a current compensation circuit which includes a first feedback current mirror 42 and a second feedback current mirror 44, along with NFET T4 and PFET T5 grouped as part of the current mismatch measurement circuit 40. The current mismatch measurement circuit 40 also includes an operational amplifier 46 connected via line 47 to the control gates of NFET T4 and PFET T5. NFET T4 and PFET T5 act as source followers to the voltage on output line 47 of operational amplifier 46. Together, op amp 46 and source followers T4 and T5 operate as a voltage follower subcircuit which applies the filter control voltage at output node 31 to a common node 49 connecting a duplicate pair of complementary current sources PFET T7 and NFET T8.

PFET T7 comprises a duplicate positive current source and mirrors the current through current source PFET H4 of circuit 30. Similarly, NFET T8 is a duplicate negative current source which mirrors the current through NFET H12 of circuit 30. Since these duplicate current sources are substantially identical in all respects to the corresponding primary current sources, second circuit portion 32 is preferably integrated with first circuit portion 30 on the same semiconductor chip. Thus, whatever current mismatch exists at node 31 is duplicated at common node 49 between the secondary pair of complementary current sources T7 and T8. In addition to comprising source followers, NFET T4 and PFET T5 produce the difference current or error current sensed at node 49 between the amplitude of the positive current and the amplitude of the negative current duplicated by the secondary pair of complementary current sources PFET T7 and NFET T8.

The error current generated through NFET T4 or PFET T5 is reflected back to circuit 30 for addition to the positive current or negative current, respectively, provided to output node 31 by the primary complementary current sources. First feedback current mirror 42 and second feedback current mirror 44 of the current compensation portion of circuit 32 accomplish this function. First feedback mirror 42 comprises PFETs T2 & T3 parallel connected as shown, while second feedback current mirror 44 comprises NFETs T1 & T6, again parallel connected as shown. When fed back, the error current is substantially a dc signal having a magnitude sufficient to compensate for any amplitude difference between the positive current pulses and the negative current pulses resulting from a filter voltage at the output node of the charge pump circuit.

As an example, assume that there is a phase-locked condition within the PLL system and a high filter voltage (i.e., $>\frac{1}{2}V_{DD}$) at node 31, the amplitude of the negative current pulses will be slightly greater than the amplitude of the positive current pulses due to saturation characteristics of the current source transistors. This mismatch results in an error current flowing in NFET T4 of current mismatch measurement circuit 40 which is fedback via feedback current mirror 42 for addition to the positive current pulse produced by positive current source PFET H4. With the error current factored in, the amplitude of the positive current pulses and the amplitude of the negative current pulses are equal. Similarly, when the filter voltage at output node 31 is lower than $\frac{1}{2}V_{DD}$, the amplitude of the positive current produced is greater than the amplitude of the negative current, resulting in an error current flowing in PFET T5 of the current mismatch measurement circuit. This error current is reflected back through second feedback current mirror 44 for combining with the negative current from negative current source H12. Again, compensation is achieved.

Figure 3:
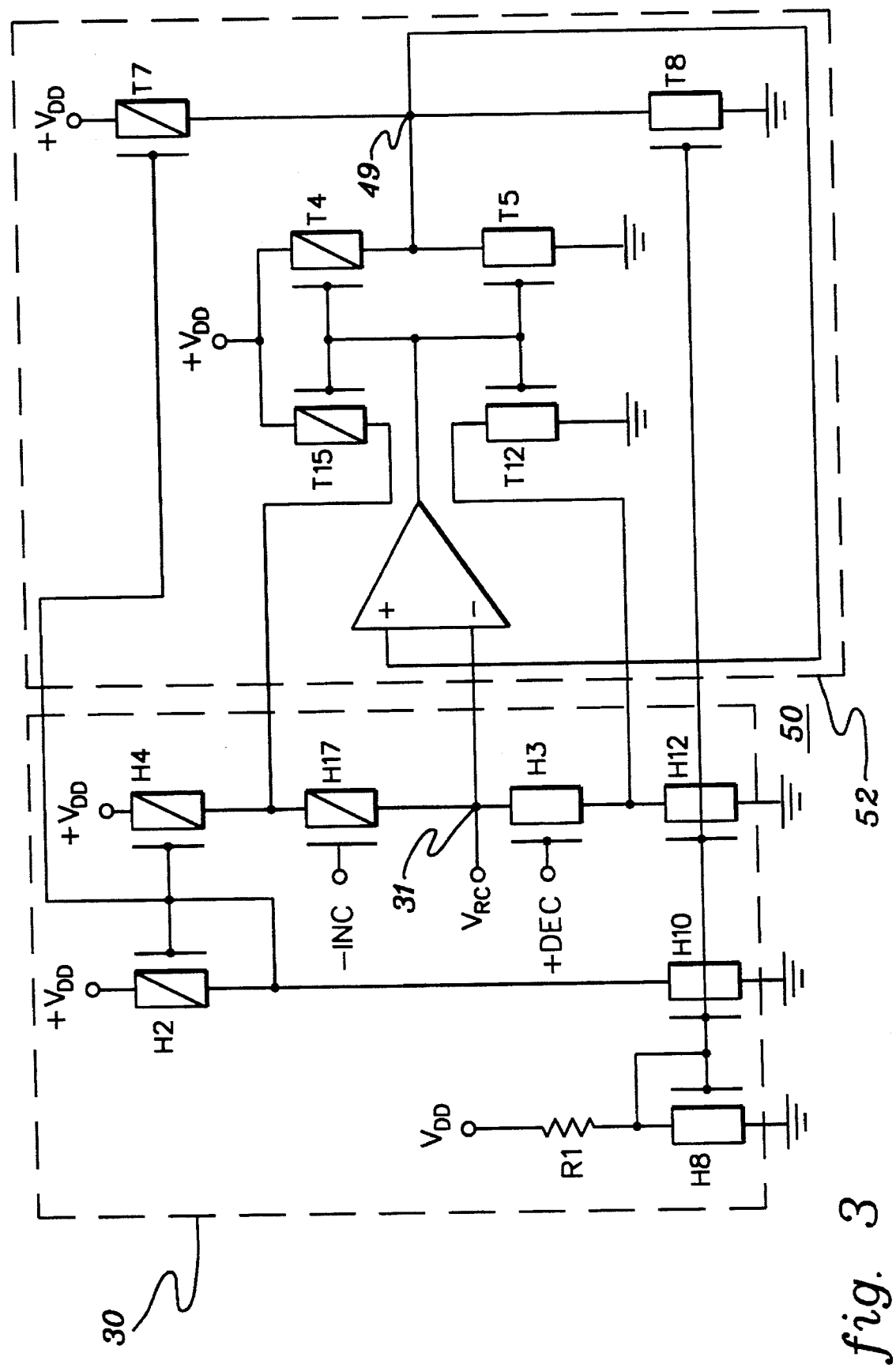
FIG. 3 is a schematic diagram of an alternate embodiment of a symmetrical charge pump circuit in accordance with the present invention.

Because transistors T4 & T5 are connected as source followers, the dynamic range of operation for the charge pump circuit presented is between $V_t$ and $V_{DD}-V_t$, wherein $V_t$ comprises the threshold voltage value for the transistors employed. FIG. 3 depicts another embodiment of a charge pump circuit pursuant to the present invention wherein the dynamic range is extended to cover substantially nearly the whole range from ground to the positive power supply value $V_{DD}$. In accordance with the invention, this charge pump circuit, generally denoted 50, accomplishes the same functions as circuit 14 of FIG. 2. Circuit 50 has a first circuit portion 30 and a second circuit portion 52. First circuit portion 30 comprises substantially the same circuit as that described above in connection with charge pump circuit 14 of FIG. 2.

Second circuit portion 52 of charge pump circuit 50 is similar to circuit portion 32 of charge pump circuit 14 (FIG. 2). However, in second circuit portion 52 transistors T4 & T5 are connected to operate as inverting amplifiers rather than source followers. This adds an inversion to the voltage follower loop such that the output thereof is fed back to the positive operational amplifier input rather than the negative op amp input as with the charge pump circuit embodiment of FIG. 2. The error current still flows in one of transistors T4 & T5 depending upon its polarity and is mirrored by a PFET T15 or NFET T12, respectively. Current mirrors T15 & T12 feedback the error circuit to either the positive current leg or the negative current leg of the primary pair of complementary current sources described above.

Figure 4:
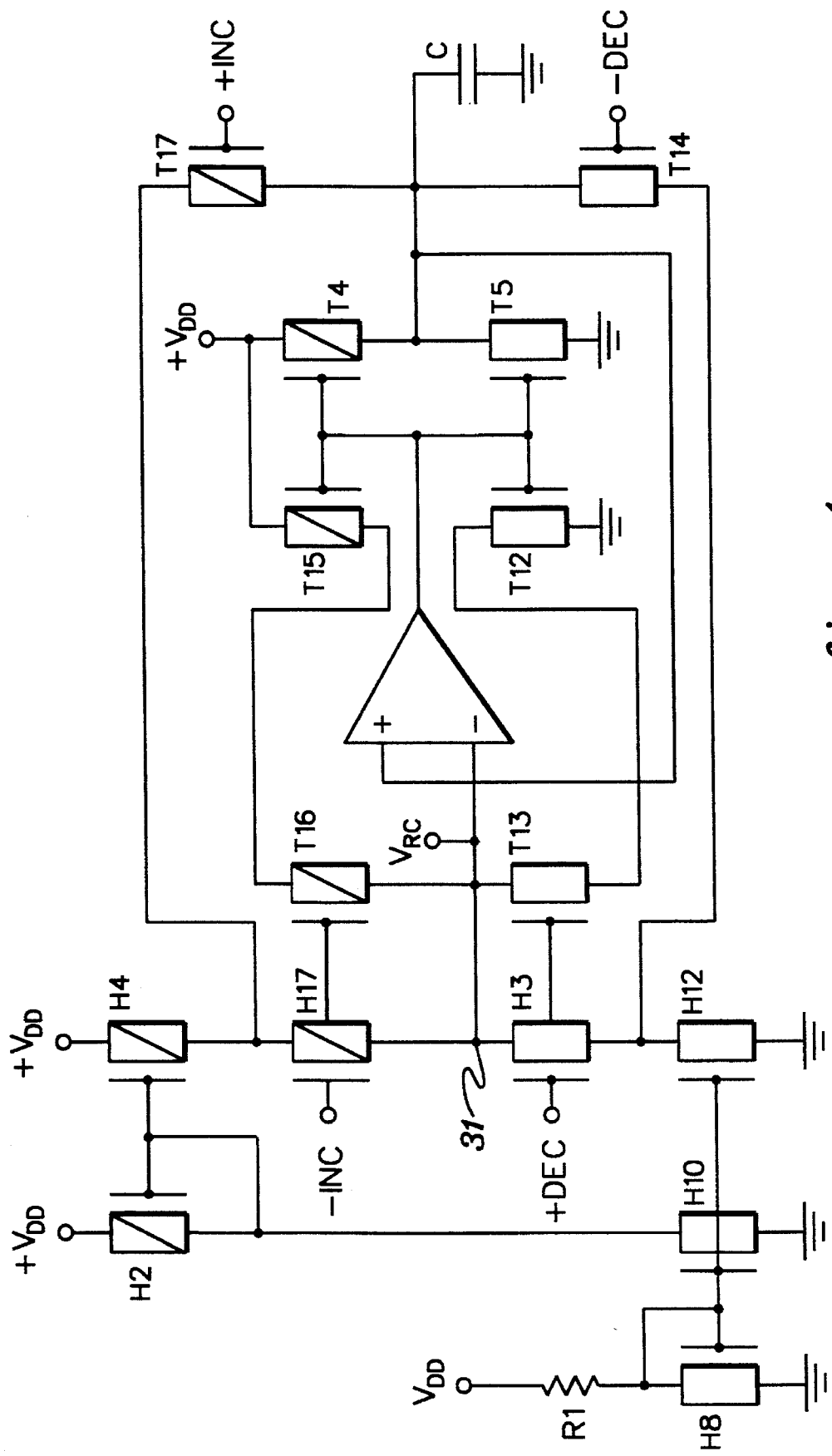
FIG. 4 is a schematic diagram of a further alternate embodiment of a symmetrical charge pump circuit in accordance with the present invention.

Those skilled in the art will recognize that other circuit implementations of the present concepts are possible. For example, FIG. 4 depicts an embodiment of a current compensation circuit employing time multiplexing in accordance with the invention. In this embodiment, the primary complementary current sources H4 and H12 are switched to the current mismatch measurement circuit whenever the current sources are not switched into the charge pump's output node 31. In a phase-locked condition, the primary current sources are available to the current mismatch measurement circuit nearly all of the time. A large capacitor "C" holds the correction value during the narrow output pulses to node 31. When the loop is unlocked, the loop gain is increased by the addition of the full scale correction current which has the effect of reducing the capture time. Alternatively, the compensation circuit could be disabled in the unlocked condition.

As noted in the above description, a current source circuit for a phase-controlled loop system is provided which exhibits no offset error when in phase-locked condition. This is attained via a current mismatch measurement mechanism and a current compensation mechanism for equalizing the amplitude of positive current pulses and the amplitude of negative current pulses at the output node of the charge pump circuit when in phase-locked condition. By eliminating offset error, phase alignment of the PLL clock output and the input reference clock is enhanced, thereby improving system performance.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A current source circuit for use in a phase-controlled loop system having a filter, said current source circuit comprising:
   an output node coupled to the filter so as to provide a control voltage thereto;
   a primary pair of complementary current sources connected to the output node, each current source of said primary pair of complementary current sources supplying a different one of a positive current and a negative current to said output node, said positive current and said negative current each having an amplitude dependent upon the control voltage at the output node when in a phase-locked condition; and
   feedback means for continuously sensing an amplitude difference between the amplitude of the positive current and the amplitude of the negative current when the phase-controlled loop system is in phase-locked condition and for compensating at the output node for said amplitude difference such that the amplitude difference between the positive current and the negative current supplied by said primary pair of complementary current sources is canceled when the phase-controlled loop system is in said phase-locked condition.

2. The current source circuit of claim 1, wherein said feedback means includes means for producing an error current having an amplitude equal to the difference between the amplitude of the positive current and the amplitude of the negative current when the phase-controlled loop system is in said phase-locked condition, and means for providing the error current to the output node such that the amplitude difference is canceled.

3. The current source circuit of claim 2, wherein said feedback means includes a secondary pair of complementary current sources connected to produce identical positive and negative currents to the positive and negative currents, respectively, produced by said primary pair of complementary current sources when the phase-controlled loop system is in said phase-locked condition, said feedback means including a current mismatch measurement circuit for determining the current mismatch between the positive current and the negative current of the secondary pair of complementary current sources.

4. The current source circuit of claim 3, wherein the current sources of said secondary pair of complementary current sources are connected in series with a common node therebetween, and wherein said feedback means further includes a voltage follower circuit connected between the output node and the common node of said secondary pair of complementary current sources for translating the control voltage at the output node to the common node.

5. The current source circuit of claim 4, wherein said voltage follower circuit comprises an operational amplifier having a first input connected to the output node and a second input connected to the common node of said secondary pair of complementary current sources, an output of said operational amplifier being connected to a source follower circuit, said source follower circuit also being connected to said common node of said secondary pair of complementary current sources.

6. The current source circuit of claim 2, wherein said means for providing the error current to the output node includes a first current mirror feedback circuit and a second current mirror feedback circuit, said first current mirror feedback circuit being connected to reflect said error signal to the output node when said error signal comprises a positive feedback current and said second current mirror feedback circuit being connected to reflect said error signal to the output node when said error signal comprises a negative feedback current.

7. The current source circuit of claim 1, further comprising a first switch means and a second switch means, said first switch means being connected to control the positive current output to the output node produced by a current source of the primary pair of complementary current sources and said second switch means being connected to control the negative current output to the output node produced by the other current source of said primary pair of complementary current sources, said feedback means being coupled to said primary pair of complementary current sources such that said first switch means controls transfer of positive feedback current to the output node and said second switch means controls transfer of negative feedback current to the output node.

8. The current source circuit of claim 1, wherein said feedback means includes means for time multiplexing the positive current and the negative current produced by the primary pair of complementary current sources between the output node and the means for sensing the amplitude difference between the amplitude of the positive current and the amplitude of the negative current when the phase-controlled loop system is in phase-locked condition.

9. The current source circuit of claim 8, wherein said means for compensating for the amplitude difference includes means for producing a correction value, and wherein said time multiplexing means includes a capacitor to hold the correction value when the positive current and the negative current are time multiplexed to the output node.

10. The current source circuit of claim 1, wherein said phase-controlled loop system comprises a phase-locked loop (PLL) system wherein the control voltage provided by the output node drives a voltage controlled oscillator which provides an output clock signal.

11. A current source circuit for use in a phase-controlled loop system having a filter, said current source circuit comprising:
    an output node coupled to the filter so as to provide a control voltage thereto;
    a charge pump having means for sourcing a positive current to the output node and means for sourcing a negative current from the output node, said positive current and said negative current each having an amplitude dependent upon the control voltage at the output node; and
    feedback means for continuously sensing an amplitude difference between the amplitude of the positive current and the amplitude of the negative current when the phase-controlled system is in a phase-locked condition and for compensating at the output node for said amplitude difference so that the amplitude difference between the positive current and the negative current supplied by the charge pump is canceled at the output node when the phase-controlled loop system is in phase-locked condition.

12. The current source circuit of claim 11, wherein said feedback means for compensating at the output node for said difference includes means for producing an error current having an amplitude equal to said amplitude difference and means for providing the error current to the output node such that the amplitude difference is canceled at the output node when the phase-controlled loop system is in phase-locked condition.

13. The current source circuit of claim 12, wherein said feedback means for sensing the amplitude difference includes a current mismatch measurement circuit, said current mismatch measurement circuit having a voltage follower circuit connected to the output node.

14. The current source circuit of claim 11, wherein said feedback means for sensing the amplitude difference includes a current mismatch measurement circuit and means for time multiplexing the positive current and the negative current sourced by said charge pump between the output node and said current mismatch measurement circuit.

15. A phase-locked loop (PLL) system for providing an output signal in phase with a received reference signal, said PLL system comprising:

a phase comparator having a first input and a second input, said first input being coupled to receive the reference signal and said second input being coupled to receive as feedback the output signal, said phase comparator including means for comparing the phases of the reference signal and the output signal and for selectively providing one of a charge increase command and a charge decrease command;

a filter having a filter node;

a voltage controlled oscillator coupled to said filter for providing the output signal in response to a control voltage applied to the filter node; and a charge pump coupled between said phase comparator and said filter for applying the control voltage to the filter and having an output node connected to the filter node, and means for sourcing a positive current to the output node in response to a charge increase command and means for sourcing a negative current from the output node in response to a charge decrease command, said charge pump further including feedback means for continuously sensing an amplitude difference between the amplitude of the positive current and the amplitude of the negative current when the PLL system is in a phase-locked condition and for compensating at the output node for said amplitude difference such that positive and negative currents of equal amplitude appear at the output node of said charge pump when the PLL system is in said phase-locked condition.

16. The PLL system of claim 15, wherein said feedback means includes means for producing an error signal having an amplitude equal to the difference between the amplitude of the positive current and the amplitude of the negative current and means for providing the error signal to the output node such that the amplitude difference between the positive current and the negative current is canceled when the PLL system is in said phase-locked condition.

17. The PLL system of claim 16, wherein said means for providing the error signal to the output node includes a first current mirror feedback circuit and a second current mirror feedback circuit, said first current mirror feedback circuit being connected to reflect said error signal to the output node when said error signal comprises a positive feedback current and said second current mirror feedback circuit being connected to reflect said error signal to the output node when said error signal comprises a negative feedback current.

18. The PLL system of claim 15, wherein said charge pump's means for sourcing a positive current to the output node in response to a charge increase command and means for sourcing a negative current to the output node in response to a charge decrease command includes a primary pair of complementary current sources connected to the output node, each current source of said primary pair of complementary current sources supplying a different one of said positive current and said negative current to said output node.

19. The PLL system of claim 18, wherein said charge pump's feedback means also includes a secondary pair of complementary current sources connected to produce identical positive and negative currents to the positive and negative currents, respectively, produced by said primary pair of complementary current sources when the PLL system is in said phase-locked condition, said feedback means including a current mismatch measurement circuit for determining the current mismatch between the positive current and the negative current of the secondary pair of complementary current sources.

20. The PLL system of claim 19, wherein the current sources of said secondary pair of complementary current sources are connected in series with a common node therebetween, and wherein said feedback means further includes a voltage follower circuit connected between the output node and the common node of said secondary pair of complementary current sources for translating the control voltage at the output node to the common node.

\* \* \* \* \*